United States Patent

Rao

(10) Patent No.: US 7,855,916 B2
(45) Date of Patent: Dec. 21, 2010

(54) NONVOLATILE MEMORY SYSTEMS WITH EMBEDDED FAST READ AND WRITE MEMORIES

(76) Inventor: G. R. Mohan Rao, 800 W. Renner Rd., Apartment #1328, Richardson, TX (US) 75080

( * ) Notice: Subject to any disclaimer, the term of this patent is extended or adjusted under 35 U.S.C. 154(b) by 209 days.

(21) Appl. No.: 12/256,362

(22) Filed: Oct. 22, 2008

(65) Prior Publication Data

US 2009/0109787 A1 Apr. 30, 2009

Related U.S. Application Data

(60) Provisional application No. 60/982,175, filed on Oct. 24, 2007.

(51) Int. Cl.
*G11C 11/34* (2006.01)
*G11C 16/04* (2006.01)
*G06F 9/26* (2006.01)

(52) U.S. Cl. .......... 365/185.05; 365/185.11; 365/185.12; 711/202

(58) Field of Classification Search ............ 365/185.08, 365/185.11, 185.12
See application file for complete search history.

(56) References Cited

U.S. PATENT DOCUMENTS

| | | | |
|---|---|---|---|
| 4,811,303 A * | 3/1989 | Hirai | 365/185.08 |
| 5,361,227 A | 11/1994 | Tanaka et al. | |
| 6,023,781 A | 2/2000 | Hazama | |
| 6,522,586 B2 * | 2/2003 | Wong | 365/185.25 |
| 6,614,703 B2 * | 9/2003 | Pitts et al. | 365/221 |
| 7,099,215 B1 * | 8/2006 | Rotenberg et al. | 365/204 |
| 7,286,401 B2 * | 10/2007 | Ishimaru et al. | 365/185.11 |
| 7,324,385 B2 * | 1/2008 | Mobley et al. | 365/185.29 |
| 7,433,258 B2 | 10/2008 | Rao | |

OTHER PUBLICATIONS

Numonyx, White Paper entitled "Designing a cellular low power DDR non-volatile memory system," circa Jul. 1998, pp. 1-4 (copy attached).
Toshiba, "NAND Flash Applications Design Guide," Revision 1.0, Apr. 2003, pp. 6-17 (copy attached).
Samsung, Flash Memory Product Specification K9F1G08X0A, pp. 1-10 (copy attached), Jan. 2006.
Micron, "Technical Note NAND Flash Performance Increase Using the Micron—Page Read Cache Mode Command," TN-29-01 Rev. E, May 2007, pp. 1-7 (copy attached).

* cited by examiner

*Primary Examiner*—Ly D Pham
(74) *Attorney, Agent, or Firm*—Eugene M. Cummings, P.C.

(57) ABSTRACT

A nonvolatile memory system is described with novel architecture coupling nonvolatile storage memory with random access volatile memory. New commands are included to enhance the read and write performance of the memory system.

1 Claim, 12 Drawing Sheets

Exemplary NAND memory IC

NONVOLATILE MEMORY SYSTEMS

1) Always 'available' "already erased" block (AEB) for fast write
2) AEB for "reverse boot' - namely, copy SRAM to NVM (NAND, NOR whatever)
3) AEB equal in density to at least 1 sector for DATA protection during/prior to "power off"

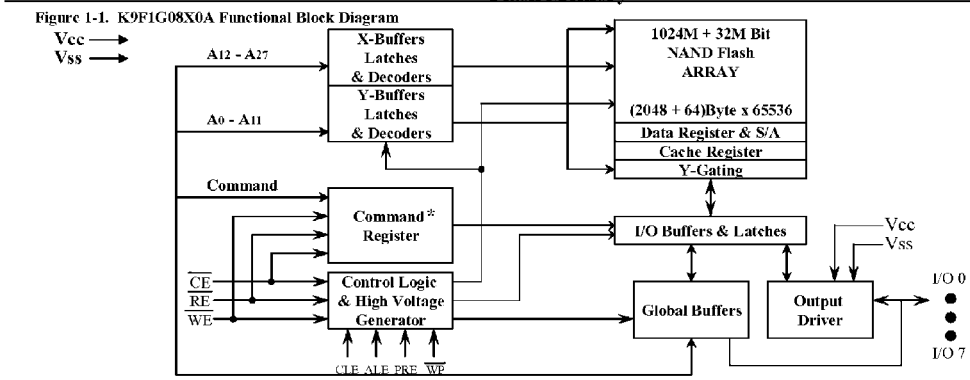
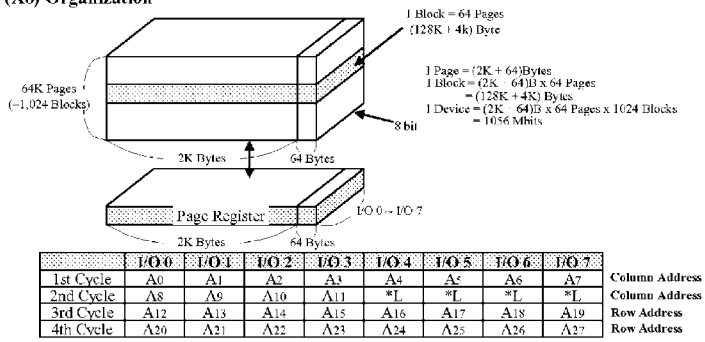
Fig. 6

NVMS Configuring the present NAND flash into a "NAND plus RAM"

The current 1Gbit Samsung NAND flash (example of), as shown earlier has large blocks, page per block, and memory "NC" (no connect pins).
See below

K9F1G08R0A
K9F1G08U0A     K9K2G08U1A                        FLASH MEMORY

K9F1G08R0A
K9F1G08U0A   K9K2G08U1A

NONVOLATILE MEMORY SYSTEMS

FLASH MEMORY 128M x 8 Bit/256M x 8 Bit NAND Flash Memory

| Part Number | Vcc Range | Organization | PKG Type |
|---|---|---|---|
| K9F1G08R0A | 1.65 ~ 1.95V | X8 | FBGA |
| K9F1G08U0A-Y, P | | | TSOP1 |
| K9F1G08U0A-V, F | 2.7 ~ 3.6V | | WSOP1 |
| K9K2G08U1A-I | | | 52-ULGA |

FEATURES
- Voltage Supply
  - 1.8V device(K9F1G08R0A): 1.65V~1.95V
  - 3.3V device(K9F1G08U0A): 2.7V~3.6V
- Organization
  - Memory Cell Array: (128M + 4,096K)bit x 8bit
  - Data Register:(2K + 64)bit x 8bit
  - Cache Register:(2K + 64)bit x 8bit
- Automatic Program and Erase
  - Page Program: (2K + 64)Byte
  - Block Erase : (128K +4K)Byte
- Page Read Operation
  - Page Size : 2K-Byte
  - Random Read : 25µs(Max.)
  - Serial Access: 30ns(Min.)-3.3v device
                  50ns(Min.)-1.8v device

- Fast Write Cycle Time
  - Program time : 200µs(Typ.)
  - Block Erase time : 200ms(Typ.)
- Command/Address/Data Multiplexed I/O Port
- Hardware Data Protection
  - Program/Erase Lockout During Power Transitions
- Reliable CMOS Floating-Gate Technology
  - Endurance : 100K Program/Erase Cycles
  - Data Retention : 10 Years
- Command Register Operation
- Cache Program Operation for High Performance Program
- Intelligent Copy-Back Operation
- Unique ID for Copyright Protection
- Package:
  - K9F1G08R0A-GCB0/GIB0
    63-Ball FBGA
  - K9F1G08R0A-JCB0/JIB0
    63-Ball FBGA - Pb-free Package
  - K9F1G08U0A-YCB0/YIB0
    48 - Pin TSOP I (12 x 20 / 0.5mm pitch)
  - K9F1G08U0A-VIB0
    48 - Pin WSOP I (12X17X0.7mm)
  - K9F1G08U0A-PCB0/PIB0
    48 - Pin TSOP I (12 x 20 / 0.5mm pitch)- Pb-free Package
  - K9F1G08U0A-FIB0
    48 - Pin WSOP I (12X17X0.7mm) - Pb-free Package
    *K9F1G08U0A-V,F(WSOPI) is the same device as
    K9F1G08U0A-Y,P(TSOP1) except package type
  - K9K2G08U1A-ICB0/IIB0
    52-ULGA (12X17X0.65mm)

Fig. 8

NONVOLATILE MEMORY SYSTEMS

- There may be other ways to prevent 'writing into flash' - yet, load the 'page' for subsequent data accesses of all kinds, without disturbing the page, to which the flash block/sector/bank belongs

NONVOLATILE MEMORY SYSTEMS

- Battery back up SRAM/and/or DRAM with flash (or similar nonvolatile memory with slow write time)

Have the SRAM and/or DRAM store writes and write to NV memory only in "idle" or "no interrupt with RAM" time Provide battery back up for RAM so data in RAM is not lost DRAM and/or SRAM density can be about 1/10th (10%) of NV density e.g., 256Mb of RAM for 3 to 4 Gbits of NV(like flash)

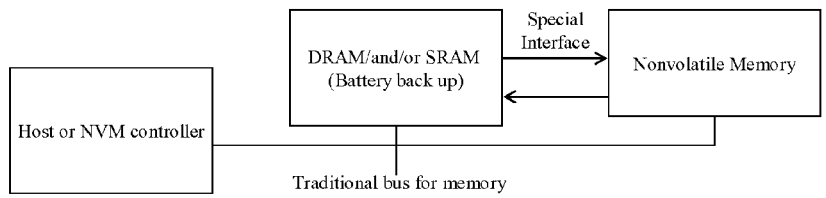

This goes beyond the "multi chip package solutions" of PSRAM/flash offered in cell phones today

- Include new commands in registers of BOTH, RAM and NV.

Fig. 10

New 2T/1C with shared bit lines
Prior art
U.S. 5, 856, 940 (Inventor: Above)
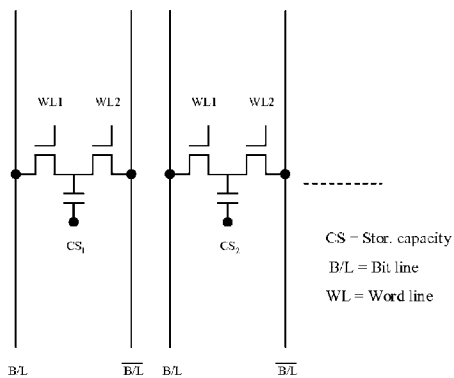
New invention
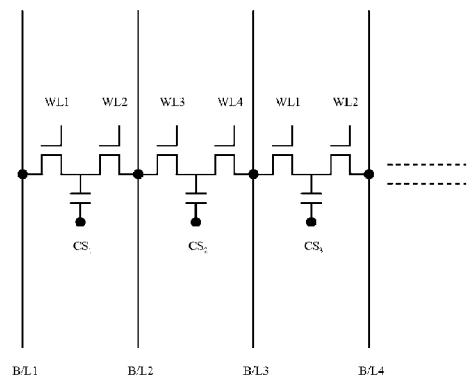
CS = Stor. capacity
B/L = Bit line
WL = Word line
2 Transistors, 2 Bit lines, 2 Word lines per storage bit
NOTE: WL1, WL2 for each CS are "mirrored"
1) 2 Transistors, <u>Shared bit lines for adjacent cells,</u> 2 Word lines per storage bit (Dual Port).
2) Hard wire WL1/WL3: WL2/WL4 for dual port.
Fig. 11

NONVOLATILE MEMORY SYSTEMS

Nonvolatile memory module with volatile memory

- Volatile memory can be DRAM, SRAM or combination
- Nonvolatile memory can be any kind of flash, MAGRAM, FeRAM, CNT etc.
- Read/write can be through VM(Volatile Memory) which acts as a cache buffer (both data and address, could be command as well)

NONVOLATILE MEMORY SYSTEMS WITH EMBEDDED FAST READ AND WRITE MEMORIES

CROSS-REFERENCE TO RELATED APPLICATIONS

This application claims priority to provisional application No. 60/982,175, filed on Oct. 24, 2007, which application is incorporated herein by reference.

STATEMENT REGARDING FEDERALLY SPONSORED RESEARCH OR DEVELOPMENT

Not Applicable.

REFERENCE TO SEQUENCE LISTING, A TABLE, OR A COMPUTER PROGRAM LISTING COMPACT DISC APPENDIX

Not Applicable.

BACKGROUND OF THE INVENTION

Nonvolatile memory systems, subsystems and integrated circuits are used in multiple consumer, computer and communications applications. They can be a NAND flash memory IC or NOR flash memory. Part of the memory system may contain volatile memory like static random access memory (SRAM) or dynamic random access memory (DRAM). They can be many IC's mounted on a memory card or module. A subsystem may contain at least one such module and a memory controller. A system may contain several subsystems as well as multi core CPU's (Central Processing Unit). The memory integrated circuits used in such a system may be SLC (single level) or MLC (multi level) storage. The read/write access ports to the system may be single ported or multi ported.

Today's dominant memory is flash. In flash, the dominant architecture is NAND flash. In spite of the fact that the internal IC architecture of NAND (or for that matter other flash architectures like NOR, OneNAND™) has "page" architecture for read and write access, the performance (read time, program/write time) is slow compared to volatile memory systems built with SRAMs and DRAMs. The "page" architecture in NAND indeed has "static latches" that can temporarily store data as a buffer (one page per block), and sometimes have an additional "write cache buffer" for the whole IC. The page is 1 KB (1,024 bytes) to 2 KB (2,048 bytes). Each nonvolatile memory block of NAND flash memory cells, may have 64 to 128 pages (or, 128 KB to 256 KB). Still, the performance is relatively poor to mediocre at best from a randomly and independently accessible perspective per each byte of data. The "page buffered architecture" of today's NAND flash memory does not lend itself to true, fast, read and write memory access for SSD (solid state disk) and similar commercial applications in PCs and servers for data computation, storage and multimedia execution.

The invention described in this utility patent application focuses on ways to modify the already existing "buffers" in an optimal manner to enhance the random access performance of nonvolatile IC, subsystem and system. The volatile random access memory (RAM) in a preferred embodiment is a 6-transistor SRAM memory cell at the core, and complete peripheral address decoding circuitry for independent accessible access (read, write etc) at a fine grain level of a bit, or byte. In another embodiment, the volatile RAM in each block can be an 8-transistor dual-ported SRAM. In another embodiment, the nonvolatile memory can be a DRAM. The invention is applicable to other nonvolatile or pseudo non volatile memories like PCM (phase change memory), nano crystalline memory, charge trapped memory, ferroelectric memory, magnetic memory, plastic memory and similar embodiments.

BRIEF SUMMARY OF THE INVENTION

The preferred embodiment adds new commands to be executed in the Command Register of the NVM (nonvolatile memory). In other embodiments, these commands can be shared between the NVM IC and memory controller. Prior art NVM IC's have limited commands like (1) read page in flash; (2) erase block in flash; (3) program page in flash, etc. With this invention, new additional commands are executed: (4) read page in the SRAM of the block only; (5) read new page from the nonvolatile memory (NVM) block; (6) write page into SRAM of the block, but, not program into the NVM block until such a command is additionally given. This invention provides every page of each NVM block as an independently accessible random access memory to perform load/store applications, as well as a coupled memory to the assigned NVM block. Each NVM NAND flash may have 1,024 such blocks. Each block is typically 64 kilobytes in density. Page for each block is typically 1 to 2 kilobytes and each bit is independently addressable in a random manner, as well as accessed in a random manner. Error correction and detection to the memory on a page basis can be implemented as well either on the NVM IC or in the memory controller.

Another preferred embodiment selects any of the currently unused blocks and uses the SRAM pages in those blocks to perform other operations as necessary. Such data manipulating operations can be arithmetic and/or logic operations. In another preferred embodiment, the "volatile memory of a page" is a DRAM. That DRAM, again, is independently accessible and addressable in a random manner.

BRIEF DESCRIPTIONS OF THE DRAWINGS

FIG. 6 shows a current NAND flash chip architecture by Samsung.

FIG. 8 shows some operational features of the above Samsung flash memory.

FIG. 10 shows improved features of this invention compared to currently available (commercial) multichip NVMS solutions.

FIG. 11 shows how the "random access memory" of this invention can be implemented in dual port access for enhanced performance.

DETAILED DESCRIPTION OF THE INVENTION

Each NAND flash memory commercially available (in various pin outs/densities) today has a 512 B-1 KB-2 KByte page in a 64Kb to 128K Byte block (a block contains at least one sector), 64 rows worth of data, 1 page/sector. To write one page takes about 200 μs. There are about 1,024 sectors in a 1 Gbit flash (NAND). So each NAND flash chip has 1 Mb SRAM (1 k pages). The invention requires each page to have "bit-to-bit" NVM back up (nonvolatile SRAM). So a page can be copied directly to the NVM as needed. This additional row can be in the sector itself. Address/control logic to accommodate this page can be easily done in the sector, if needed.

Page invention—Modify page as shown in Samsung K9F1G08R0A (1 Gbit NANDflash). In the Samsung device, Page is approximately 2 KByte+64 bits (for some kind of Ecc) in each 128 KByte block. There are 1 K blocks, each of 128 KBytes (inclusive of Page). The Page has no direct identity (namely, it is not a register or RAM with independent random address and command executions)—it is temporary storage buffer to help execute read/write to nonvolatile array. Since each block (sector) is addressable, one can have a "Tag address bit"—if enabled it can activate "page addressing."

Figure 1:
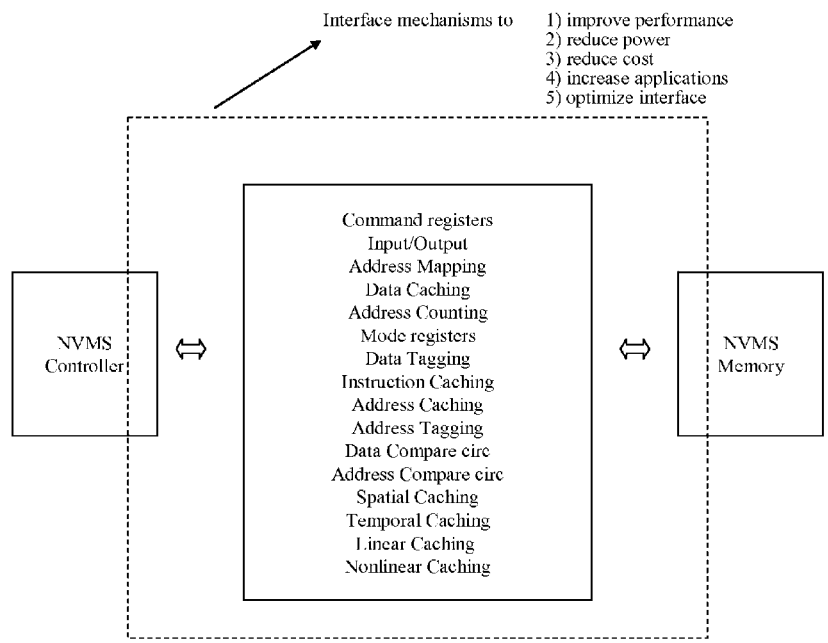
FIG. 1 is a diagram showing a nonvolatile memory system with features as described for the present invention.
Figure 2:
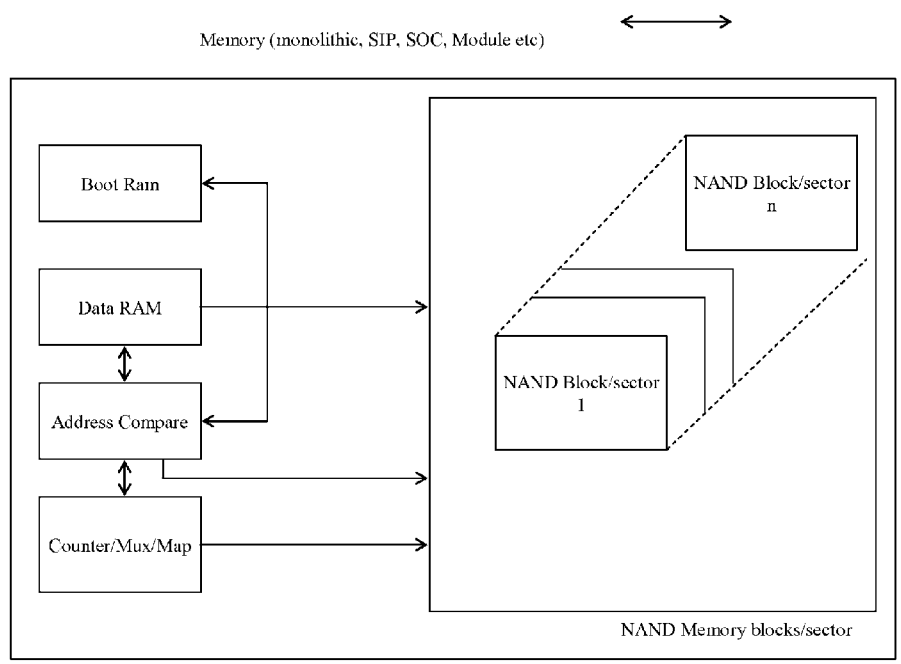
FIG. 2 shows an exemplary NAND memory integrated circuit as one element of the NVMS (nonvolatile memory system).
Figure 3:
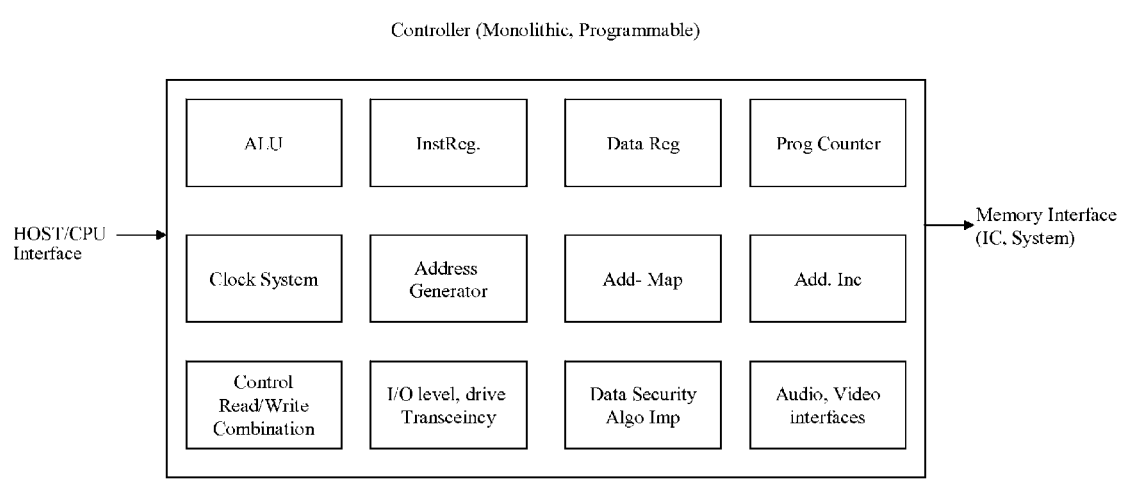
FIG. 3 shows various components of a controller for the nonvolatile memory system (NVMS) of this invention.
Figure 4:
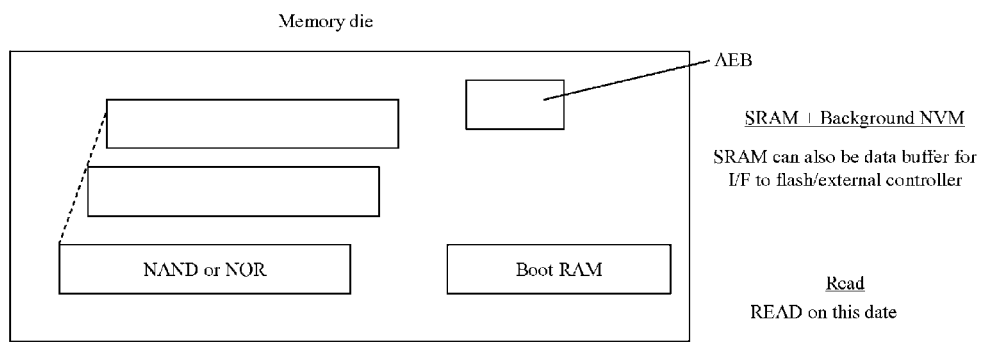
FIG. 4 shows a novel implementation of block erase per this invention.
Figure 5:
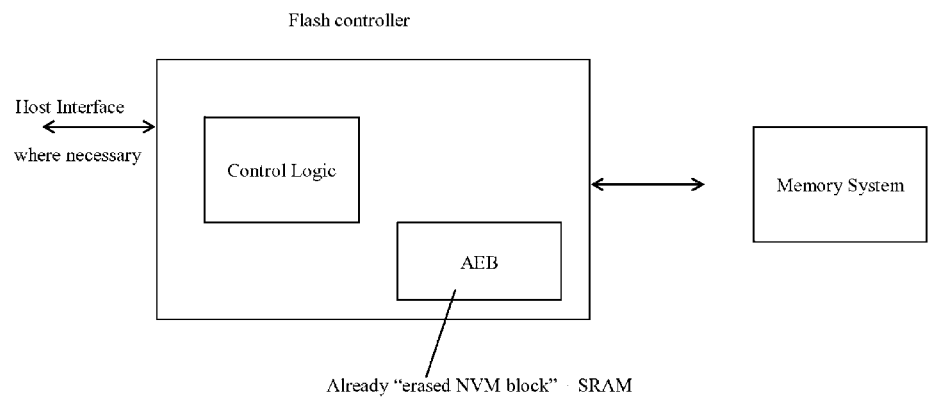
FIG. 5 shows a flash memory controller with block erase feature.
Figure 7:
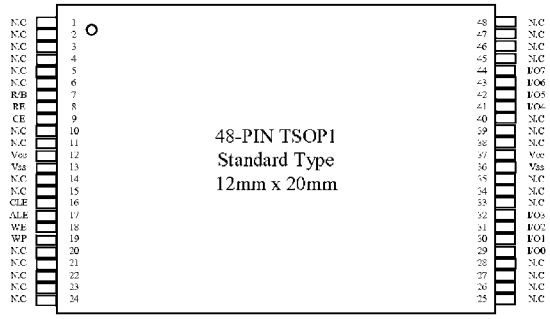
FIG. 7 shows a pin out for a 1 Gb Samsung flash memory.
Figure 9:
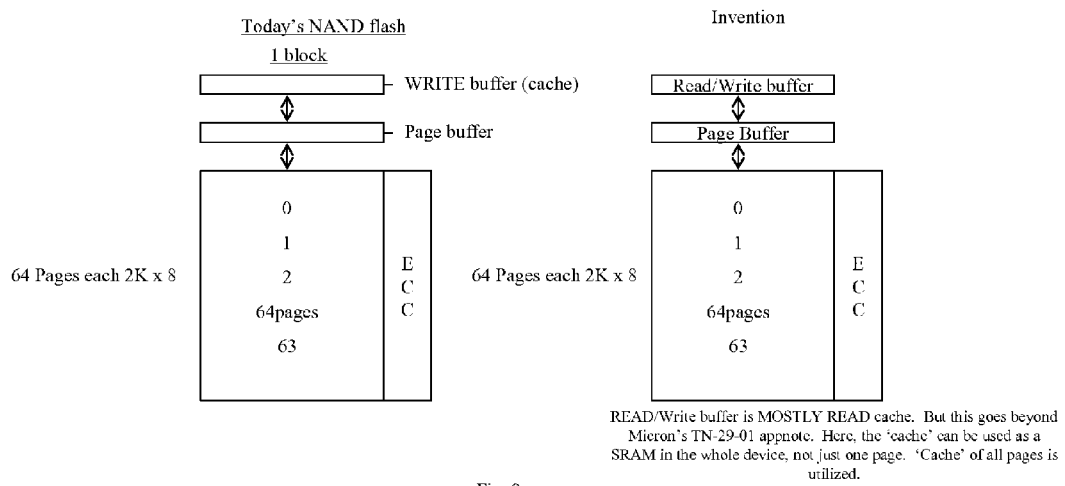
FIG. 9 shows how the invention of this patent distinguishes itself from today's nonvolatile memory.
Figure 12:
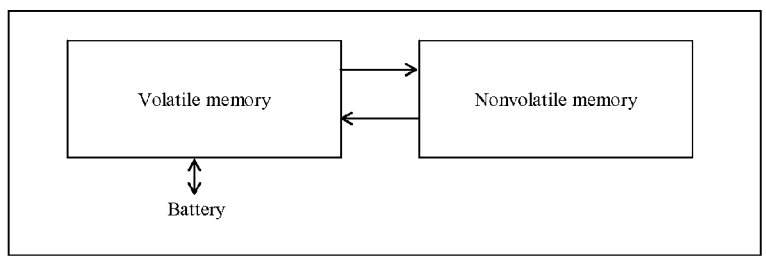
FIG. 12 shows a high level architecture of the NVMS of this invention which comprises both nonvolatile and volatile memory.

Control Page—Nonvolatile array communication with a 'Switch' where volatile and nonvolatile memory can be accessed (unlike current art)—then page 2 Kbytes can be used as independent RAM for other useful purposes. One preferred embodiment—Select any of the currently unused blocks and use that/those pages as a modified SRAM; access that SRAM by currently used NC pins and rename them. Even with "concurrent Read/Write", "write cache buffering" and other features, most blocks among the (1,024 or more) many in a NAND flash chip are unused while one or two blocks are being accessed (read, write, erase). The associated "page buffers" are also unused and wasted. In this preferred embodiment, a page of the currently unused block's page (2 K Bytes×1 Kblocks is 2 MBytes of SRAM per chip—with a little overhead circuitry it can be 2 MBytes of SRAM with multiple port access as well) can be read and written (random page access, random access within a page, serial access from a page etc.). There are plenty of NC pins available in commercially available NAND flash ICs (one example is provided in FIG. 7)—we can configure NC pins to be used as Address, DATA, Command, Control in a combination. In parallel, the NAND flash can concurrently operate.

The concepts of SRAM mode by using available pages can also be implemented in Samsung's one NAND™ flash (for example), NOR flash or even Serial EEPROM flash—The exact implementation, page/latch size, command set may vary. The concepts of SRAM mode by using available pages can also be implemented in traditional NOR flash, as well, with slight modifications (e.g., one row equivalent page in every block or sector, on chip cache, boot code, data buffers). The concepts of SRAM mode can also be implemented in other nonvolatile memory devices (and their controllers) e.g., FeRAM, MRAM, Phase change RAM/memory, CNT RAM, NROM (Saifun) and similar ones. All these concepts can configure the multiple functions of the device or combination there of by (1) control/command signals, (2) programmable registers, (3) mode registers, (4) command register, etc—they can reside in part or in whole in controller, memory, special control, command, interface chip or even CPU.

It should be made clear that the "pages" and "buffers" mentioned in these pages titled "NVMS" do not necessarily have to be (1) static latches (6 transistor latches) or (2) traditional SRAM's. They can be DRAM's as is known widely in the industry. They can be MRAM, FeRAM (ferroelectric) or other similar concepts (molecular RAM etc). The implementation of a nonvolatile memory system may contain these configurable NVMS chips as described here (one or more). Configurable NVMS can be combined with commodity NOR/NAND/One NAND, flash chips, controllers, PSRAM's, DRAM's, or other similar functions to offer a total "system-in-package" (SIP) or "system-on-chip" (SOC).

In order to conserve operating power, the unselected, yet available pages can be in a "stand by" mode—namely, reduced Vcc (power supply voltage), until the access to that page is required. Such a, 'cycle look ahead', can be built into the memory chip, or provided by controller (on chip or off chip). A battery back up for the SRAM part of the device can be a very attractive option for a very large density total nonvolatile static random access memory (NVSRAM) that can go into a broad range of applications in computer, consumer, communications etc. Maxim supplies NVSRAM's—no flash IC in NVSRAM. A "power triggered switch-off/on" (Similar to what Simtek's NVSRAM's do) is also possible, thus eliminating the "battery option".

Commands/Instructions are given as follows, in a preferred embodiment, which vary between NAND, One NAND, NOR, serial flash etc. Traditional flash: Read page in flash, Erase block in flash, Program page in flash, Etc. New commands with these inventions: Read page as SRAM/RAM, Write page as SRAM/RAM, Read/Modify/W Write page as SRAM/RAM, Read byte out of a page, etc; Write byte out of a page etc. Nibble mode/Serial access/double data rate are all possible.

The "address boundary" for a commercial NAND flash (especially in burst mode access e.g., burst READ) is different than a "2 K byte" NAND flash page. The address boundary does/should not deter by using the inventions mentioned here for a superior READ (intelligent caching) or WRITE performance. Most flash systems are weighted to MOSTLY READ and FEW ERASE/PROGRAM (WRITE) due to the obvious endurance limitations (write/erase cycles limit). Hence, any performance in READ—Speed, and available Storage space—is always beneficial to a stand alone die and/or card, module, subsystem, system. To write to a page or pseudo page, WRITE command and immediately PROGRAM SUSPEND to invalidate writing into NVM. The data should be in page/pseudo page. This is one example.

As described in earlier pages, the page latches are available for reading. The pages can be read a byte (8 bits) or 2 bytes (16 bits) at a time. The whole page 2K bytes, can be sequentially accessed in 20-25 ns/byte. The subject invention uses the pages as a content addressable memory (CAM) and the NVM core as the stored data. The match lines (as used in CAM's—refer to U.S. Pat. Nos. 6,310,880 and 6,597,596 which use a DRAM storage) can be connected to the pages. The addresses in each block can be sequentially read, until the MATCH is found.

What is claimed is:

1. A nonvolatile memory system comprising:

a nonvolatile memory for storage arranged in multiple blocks for access;

a volatile random access memory for read and write operations coupled to said nonvolatile memory;

wherein the volatile random access memory and nonvolatile memory are controlled by one or more controllers;

wherein the nonvolatile memory system is coupled to a central processing unit;

wherein each block of the nonvolatile memory for storage has one or more pages of stored data accessible through the coupled volatile random access memory; and wherein each page of a block is adapted to be substituted on the fly for any other page of a different block through address mapping.

* * * * *